(12) United States Patent
Hsu et al.

(10) Patent No.: US 7,378,601 B2
(45) Date of Patent: May 27, 2008

(54) SIGNAL TRANSMISSION STRUCTURE AND CIRCUIT SUBSTRATE THEREOF

(75) Inventors: Jimmy Hsu, Taipei Hsien (TW); Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 415 days.

(21) Appl. No.: 11/079,992

(22) Filed: Mar. 14, 2005

(65) Prior Publication Data

US 2006/0108143 A1 May 25, 2006

(30) Foreign Application Priority Data

Nov. 24, 2004 (TW) .............................. 93136103 A

(51) Int. Cl.
*H01R 12/04* (2006.01)
(52) U.S. Cl. ..................... 174/262; 174/260; 174/264; 174/265; 174/266; 361/777; 361/792; 361/795
(58) Field of Classification Search ................ 174/262, 174/255, 250, 261–266; 361/777, 780, 794, 361/792–795; 428/209–210; 333/12
See application file for complete search history.

(56) References Cited

U.S. PATENT DOCUMENTS 4,543,715 A * 10/1985 Iadarola et al. ............... 29/852
5,883,335 A * 3/1999 Mizumoto et al. .......... 174/266
6,010,769 A * 1/2000 Sasaoka et al. ............. 428/209
6,437,705 B1 * 8/2002 Barich et al. ............... 340/907
6,891,272 B1 * 5/2005 Fjelstad et al. ............. 257/774
7,034,544 B2 * 4/2006 Ye et al. ..................... 324/534
7,204,018 B2 * 4/2007 Kwong et al. ................ 29/837
2002/0139578 A1* 10/2002 Alcoe et al. ................ 174/262
2002/0179332 A1* 12/2002 Uematsu et al. ............ 174/262
2004/0069529 A1* 4/2004 Oggioni et al. ............. 174/262
2004/0262735 A1* 12/2004 Higashi et al. ............. 257/686
2005/0062556 A1* 3/2005 Aronson ....................... 333/33
2005/0126818 A1* 6/2005 Kojima et al. .............. 174/255
2005/0133251 A1* 6/2005 Chiu .......................... 174/259
2006/0180905 A1* 8/2006 Zeng et al. ................. 257/678

* cited by examiner

*Primary Examiner*—Tuan Dinh
*Assistant Examiner*—Hoa C Nguyen
(74) *Attorney, Agent, or Firm*—J.C. Patents

(57) ABSTRACT

A signal transmission structure is provided. The structure mainly comprises at least a conductive via, at least a via land and a conductive wall. One end of the conductive via is connected to the via land. The conductive wall covers only a portion of the inner wall of a through hole in the core layer of a circuit substrate. The conductive wall has a semi-circular or a C-shaped structure. Therefore, when a signal passes the conductive via and the via land of the circuit substrate through the conductive wall in the interior of the via, because of a more continuous impedance between the via land and the conductive wall, signal reflection due to impedance mismatch along the signal transmission pathway can be reduced to enhance signal transmission quality.

10 Claims, 4 Drawing Sheets

SIGNAL TRANSMISSION STRUCTURE AND CIRCUIT SUBSTRATE THEREOF

CROSS-REFERENCE TO RELATED APPLICATION

This application claims the priority benefit of Taiwan application serial no. 93136103, filed on Nov. 24, 2004.

BACKGROUND OF THE INVENTION

1. Field of the Invention

The present invention relates to a signal transmission structure. More particularly, the present invention relates to a signal transmission structure and circuit substrate thereof capable of reducing insertion loss during signal transmission.

2. Description of the Related Art

A conventional circuit substrate comprises a multiple patterned circuit layers and a plurality of dielectric layers alternately laminated on top of each other. The patterned circuit layers are formed, for example, by patterning copper foils in photolithographic and etching processes. The dielectric layers are disposed between neighboring patterned circuit layers to isolate the patterned circuit layers. In addition, the laminated circuit layers are electrically connected to each other through plating through holes (PTH) or conductive vias. The method of forming a conductive via includes performing a sequence of photolithographic processes to form a hole in the dielectric layer and then filling the hole with a conductive material to form a conductive via for electrically connecting at least two patterned circuit layers. The method of forming a plated-through-hole includes performing a mechanical drilling process to form a through hole in the laminated circuit layers and the dielectric layers or a dielectric core and then performing an electroplating operation to form a plated layer on the interior wall of the hole for electrically connecting at least two patterned circuit layers.

FIG. 1 is a schematic cross-sectional view of a conventional circuit substrate. As shown in FIG. 1, the circuit substrate 100 comprises a lamination of six patterned circuit layers. The circuit substrate 100 has a laminated layer 110 comprising a top circuit structure 120, a core layer 130 and a bottom circuit structure 140. Wherein the top circuit structure 120 comprises a plurality of patterned circuit layers and at least a dielectric layer laminated sequentially over each other above the core layer 130. Furthermore, the via lands 124 and 126 of each patterned circuit layer are electrically connected through a conductive via 125. The bottom circuit structure 140 comprises a plurality of patterned circuit layers and at least a dielectric layer laminated sequentially over each other below the core layer 130. Furthermore, the via lands 144 and 146 of each patterned circuit layer are electrically connected through a conductive via 145. In addition, the core layer 130 has a plurality of through holes 132 that connect an upper surface 130a of the core layer 130 with a lower surface 130b of the core layer 130. The inner wall of each through hole 132 is completely covered by a conductive wall 134 such that the via land 126 of the top circuit structure 120 is electrically connected to the via land 146 of the bottom circuit structure 140. Moreover, a dielectric material 150 may fill the hollow portion within the conductive wall 134 and the through hole 132.

As shown in FIG. 1, the two via lands 126 and 146 disposed on the top surface 130a and the bottom surface 130b of the dielectric core layer 130 are completely covered both ends of a through hole 132. Furthermore, these via lands 126, 146 are electrically connected to each other through a hollow cylindrical conductive wall 134. Therefore, a signal on a signal line in the top circuit structure 120 can transmit in a downward direction sequentially through a connection pad 122, the conductive vias 123, 125 and the via lands 124, 126. After passing through the conductive wall 134 which is inside the through hole 132 in the core layer 130, the signal passes sequentially through the via lands 146, 144, the conductive vias 145, 143 and another connection pad 142 to be connected externally. The aforementioned conductive structures provide a signal transmission pathway linking two devices or two terminals (not shown).

Note that in the prior art the line width of the signal lines electrically connecting two devices or two terminals must be uniform. In other words, the electrical impedance in various parts of the signal line should be constant so that the characteristic impedance is kept at a constant value when electrical signals are transmitted along the signal line. In particular, for high speed and high frequency signal transmission, fine impedance matching design between two terminals of a signal transmission path is very important to reduce signal reflection which may occur because of impedance mismatch in the signal transmission path. In other words, reducing insertion loss and correspondingly increasing the dropping of return loss during signal transmission will prevent affecting signal transmission quality. However, the two via lands 126 and 146 in a conventional design cover an area larger than the hole area of the through hole 132. Furthermore, the conductive wall 134 completely covers the inner wall of the through hole 132 in the core layer 130 that alteration of a large impedance may occur when a signal passes through the relatively large area of the two via lands 126 and 146 and the hollow cylindrical conductive wall 134. Consequently, the impedance mismatch between the conductive wall 134 and the top circuit structure 120 or the bottom circuit structure 140 becomes more serious. Moreover, when a differential signal respectively flows through the conductive walls 134, 138 on the inner walls of two neighboring through holes 132 and 136, due to electromagnetic coupling between the two conductive walls 134, 138, switching a signal will interrupt another signal in one of the neighboring through holes 132, 126 and generate cross talk. Thus, signal transmission quality will be influenced.

To resolve the aforementioned problem, the distance between two neighboring through holes 132 and 136 has to be increased. In other words, the distance between two neighboring conductive walls is increased to avoid cross talk. However, this method requires larger layout area and hence cannot be applied to a limited or high-density area of circuit layout.

In addition, a differential signal transmitting amidst the signal transmission structure will change the current return circuit and the electric field when passing through the two hollow cylindrical conductive walls 134 and 138 due to the electromagnetic coupling between the conductive walls. Accordingly, a change in the characteristic impedance will occur. Hence, when the signal is transmitted to the second through holes 132, 136, signal reflection phenomenon will occur due to non-continuous impedance in the two conductive walls 134 and 138. As a result, signal transmission quality will be affected.

For transmission of a single signal or a differential signal, the higher the operating frequency, corresponding to a same operating frequency, the greater the return loss is when the signal passes the through hole 132, so that impedance mismatch becomes more serious. Furthermore, the higher the operating frequency, corresponding to a same operating frequency, the greater the insertion loss will be increased when the signal passes the through hole 132, so that impedance mismatch becomes more serious.

As described, a signal passing through a relatively expansive via lands 126, 146 and a hollow cylindrical conductive wall 134 having a relatively large cross-sectional large area, the characteristic impedance of the top circuit structure 120 and the bottom circuit structure 140 of the circuit substrate 100 will increase with frequency. Thus, the difference from originally designed impedance value will increase leading to an aggravation of impedance mismatch in the same signal transmission pathway.

SUMMARY OF THE INVENTION

Accordingly, at least one objective of the present invention is to provide a signal transmission structure having a better impedance match to improve signal transmission quality.

Another objective of the present invention is to provide a signal transmission structure capable of increasing the distance between differential signal transmission structures within a limited layout area so as to reduce electromagnetic coupling between differential signals and cross talk.

To achieve these and other advantages and in accordance with the purpose of the invention, as embodied and broadly described herein, the invention provides a signal transmission structure, in which a through hole passes through a core layer in a multi-layered circuit board. The core layer has a top surface and a bottom surface. The through hole links the top surface with the bottom surface. The signal transmission structure mainly comprises a first conductive via, a first via land and a conductive wall. The first via land is connected to one end of the first conductive via and located on the top surface of the core layer to cover one end of the through hole. The conductive wall is disposed only on a portion of the inner wall of the through hole and is electrically connected to the first conductive via through the first via land.

The present invention also provides a differential-pair signal transmission structure suitable for a multi-layered circuit board. The multi-layered circuit board has a core layer with a top surface, a bottom surface and at least a first through hole and a second through hole. Each the first and the second through hole links the top surface with the bottom surface. The differential-pair signal transmission structure mainly comprises at least a pair of first conductive vias, a plurality of first via lands and a pair of conductive walls. The first via lands are respectively connected to one end of the pair of first conductive vias and located on the top surface of the core layer to cover one end of the first and the second through hole. The conductive walls are respectively disposed only on a portion of the inner walls of the first and the second through hole. Furthermore, the pair of the conductive walls is electrically connected to the pair of the first conductive vias through the first via lands.

The present invention also provides a circuit substrate mainly comprising a multi-layer circuit structure and a conductive wall. The multi-layer circuit structure includes a top circuit structure, a core layer and a bottom circuit structure. Furthermore, the core layer has a through hole linking a top surface and a bottom surface of the core layer. The conductive wall is disposed only on a portion of the surface of the through hole for electrically connecting the top circuit structure with the bottom circuit structure.

In the present invention, via lands occupying a smaller area and a non-circular hollow column of conductive walls are used to reduce the reflection problem occurred due to mismatch in characteristic impedance during signal transmission process. Hence, when signals are transmitted between the two via lands and the conductive walls, more continuous impedance can be obtained and the reflection problem due to impedance mismatch can be reduced; thus the transmission quality is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
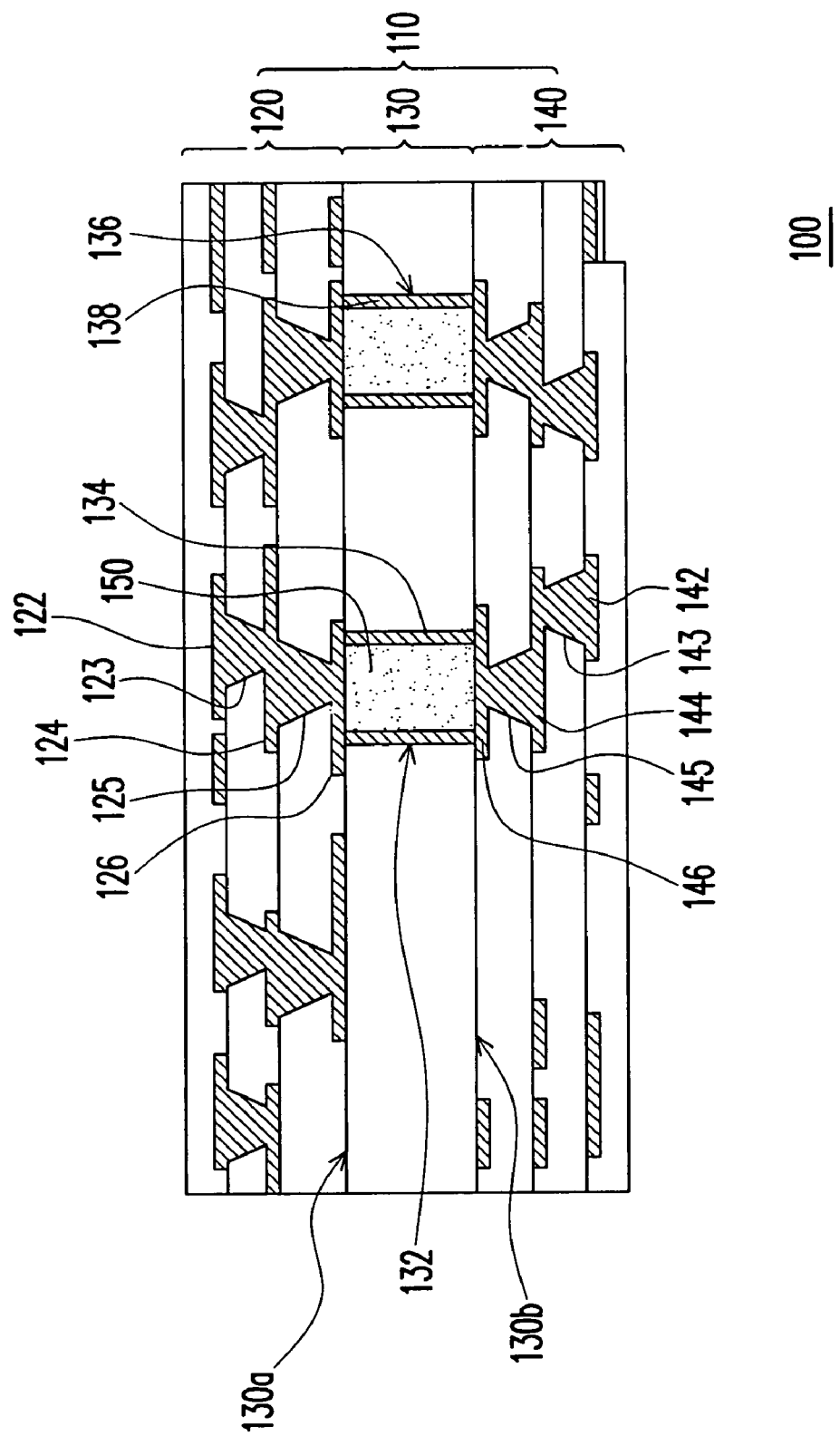
FIG. 1 is a schematic cross-sectional view of a conventional circuit substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2:
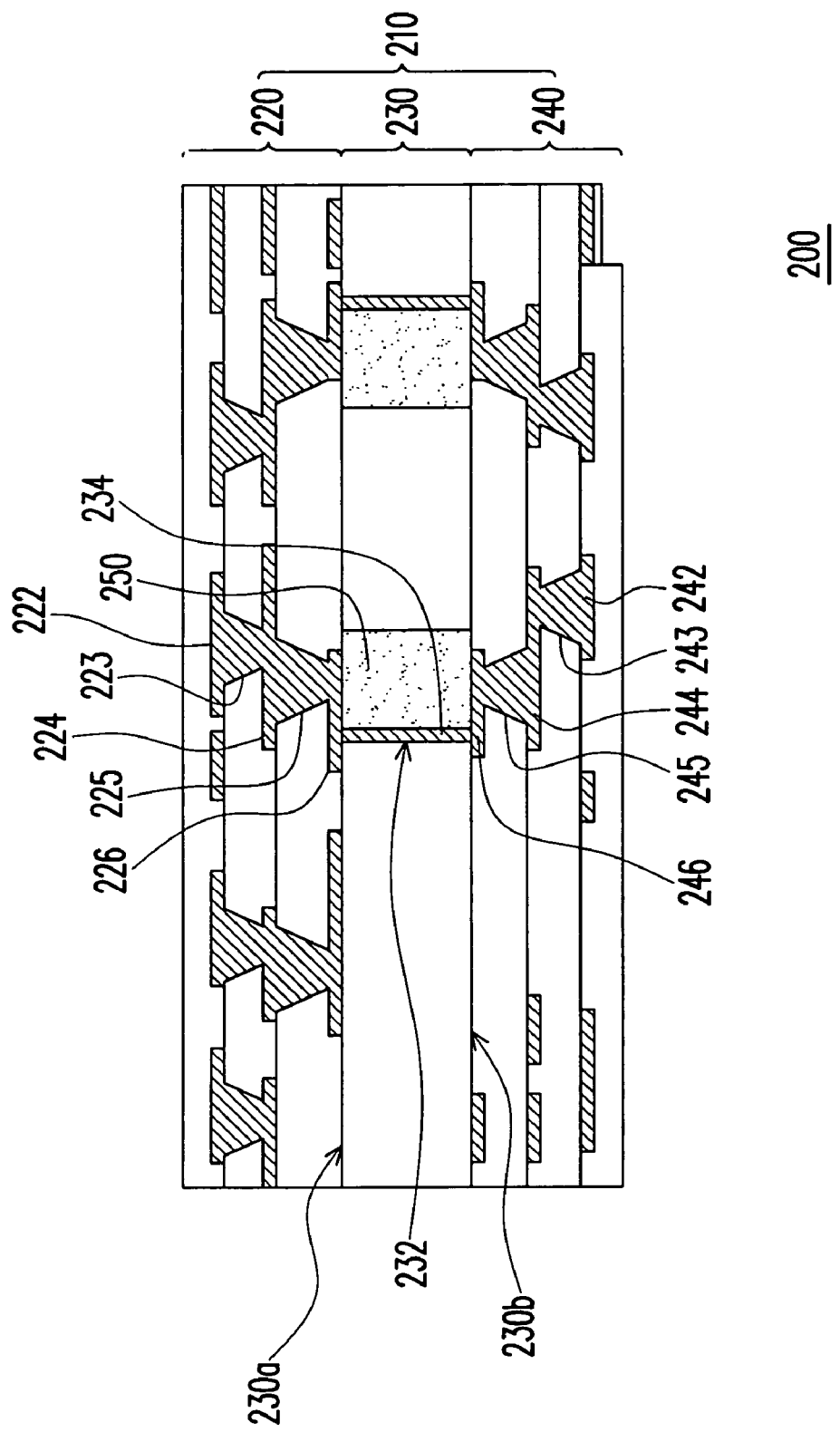
FIG. 2 is a schematic cross-sectional view of a circuit substrate according to one preferred embodiment of the present invention.

FIG. 2 is a schematic cross-sectional view of a circuit substrate according to one preferred embodiment of the present invention. A circuit substrate 200 having altogether six layers of patterned circuit layers and dielectric layer is used as an example in FIG. 2. The circuit substrate 200 has a multi-layer circuit structure 210 comprising a top circuit structure 220, a core layer 230 and a bottom circuit structure 240. The top circuit structure 220 comprises a plurality of patterned circuit layers and at least a dielectric layer alternately laid over each other above the core layer 230. The via lands 224, 226 in each patterned circuit layer are electrically connected to each other through a conductive via 245. Similarly, the bottom circuit structure 240 comprises a plurality of patterned circuit layers and at least a dielectric layer alternately laid over each other below the core layer 230. The via lands 244, 246 in each patterned circuit layer are electrically connected to each other through another conductive via 245. The core layer 230 has a plurality of through holes 232 linking a top surface 230a with a bottom surface 230b of the core layer 230. Furthermore, a conductive wall 234 that partially covers the inner wall of each through hole 232 electrically connects the top circuit structure 220 with the bottom circuit structure 240. In addition, a dielectric material 250 fills up the hollow portion between the inner wall of the through hole 232 and the conductive wall 234.

It should be noted that the conductive wall 234 covers a portion of the inner wall of a through hole 232 instead of the entire inner wall of the through hole. The conductive wall 234 has a semi-circular shape or a C-shape cross-section. Furthermore, there is only one conductive wall 234 inside the through hole 232 for transmitting a single signal. Hence, for a through hole 232 having a given diameter, reducing the horizontal cross-sectional area of the conductive wall 234 on the inner wall of the through hole 232 can narrow down the difference in characteristic impedance with the top circuit structure 220 and the bottom circuit structure 240. In other words, the conductive wall 234 can provide a more continuous characteristic impedance between the via land 226 of the top circuit structure 220 and the via land 246 of the bottom circuit structure 240. Ultimately, impedance mismatch during signal transmission is reduced.

In the aforementioned embodiment, although a through hole 232 passing through a single dielectric core layer 230 is used as an example, the through hole (not shown) may pass through at least a dielectric layer and through a plurality of patterned circuit layers. In other words, the core layer 230 can be a single dielectric layer or a multiple layers comprising a plurality of patterned circuit layers and at least a dielectric layer disposed between the patterned circuit layers. In addition, the top circuit structure 220 can be a single patterned circuit layer and the bottom circuit structure 240 can be a single patterned circuit layer for electrically connecting with an external electronic device including a chip or a printed circuit board, for example.

As shown in FIG. 2, the two via lands 226 and 246 of the top circuit structure 220 and the bottom circuit structure 240 are disposed on a top surface 230a and a bottom surface 230b of a dielectric or multi-layered core layer 230 to expose a portion of the area at each end of a through hole 232 in the core layer 230. Furthermore, the two via lands 226 and 246 are electrically connected through a non-circular hollow column-shaped conductive wall 234. Hence, a signal at a signal circuit in the top circuit structure 220 can transmit downward through the connection pad 222, the conductive vias 223, 225 and the via lands 224, 226 in sequence. After passing through the conductive wall 234 of the through hole 232 in the core layer 230, the signal continues to pass through the via lands 246, 244, the conductive vias 243, 245 and the connection pad 242 of the bottom circuit structure 240 in sequence to be connected externally. Thus, a signal transmission pathway between two devices or two terminals (not shown) is established.

It should be noted that the two via lands 226 and 246 covers only a portion of the ends of the through hole 232 so that the characteristic impedance of the via lands 226 and 246 is close to the characteristic impedance of the signal line. Hence, the two via lands 226, 246 and the signal line can have more continuous characteristic impedance when a signal passes through the two small-area via lands 226, 246. Sudden impedance change when a signal passes through large area via lands 226, 246 can be avoided. In other words, impedance mismatch between the top circuit structure 220 and the bottom circuit structure 240 is minimized.

Figure 3A:
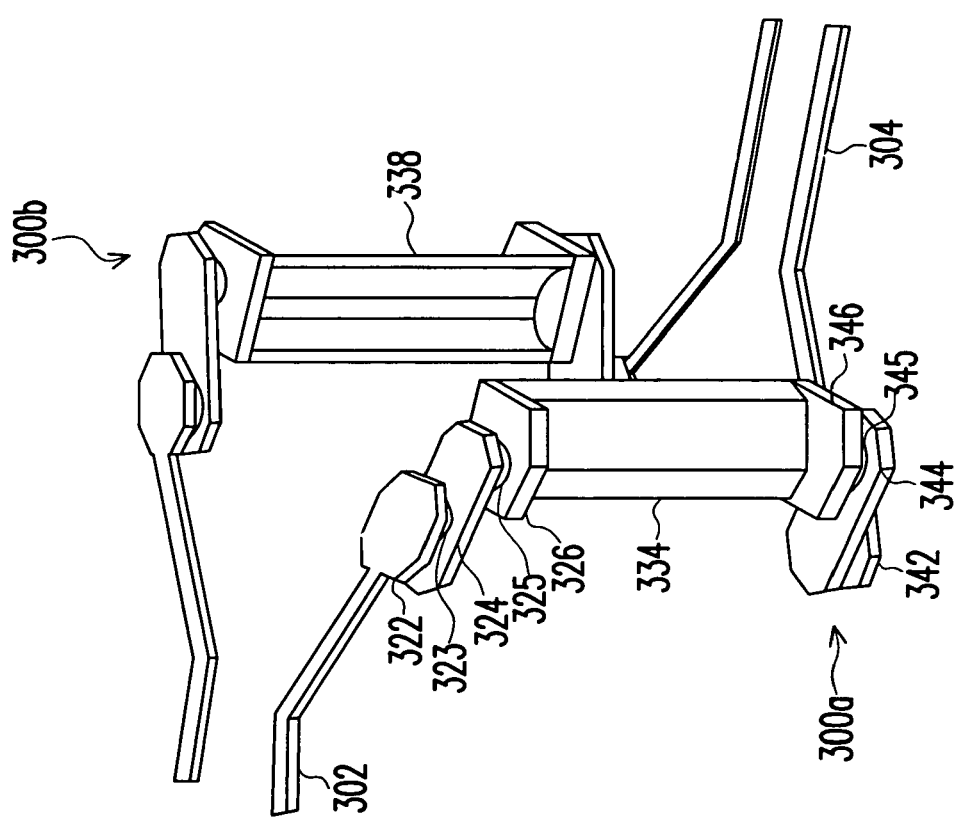
FIG. 3A is a perspective view of a differential-pair signal transmission structure according to one preferred embodiment of the present invention.
Figure 3B:
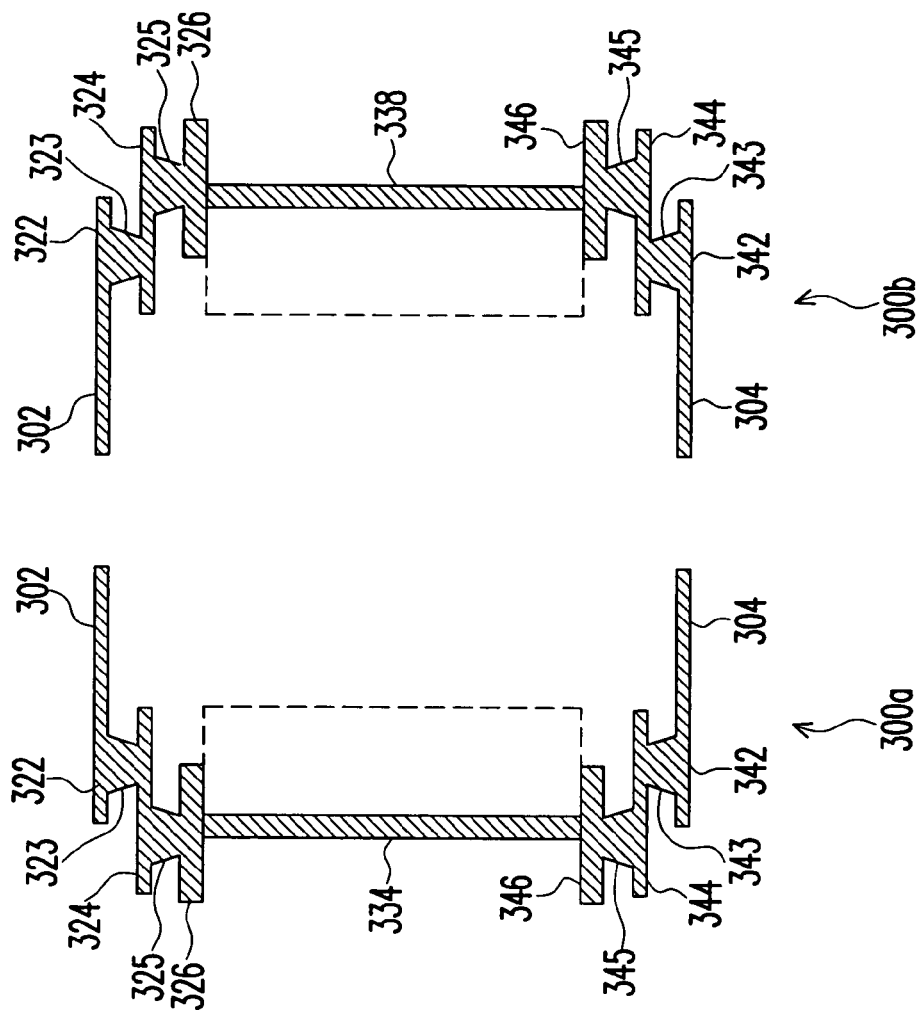
FIG. 3B is a schematic cross-sectional view of the differential-pair signal transmission structure shown in FIG. 3A.

FIG. 3A is a perspective view of a differential-pair signal transmission structure according to one preferred embodiment of the present invention. FIG. 3B is a schematic cross-sectional view of the differential-pair signal transmission structure shown in FIG. 3A. As shown in FIGS. 3A and 3B, the signal transmission structure 300a mainly comprises a plurality of first conductive vias 323, 325, a plurality of first via lands 324, 326 and a conductive wall 334. The first conductive vias 323, 325 connect the neighboring first via lands 324, 326 with the first via land 326 covering a portion of one end of the through hole 322 (in dash line). Furthermore, the conductive wall 334 is formed on a portion of the inner wall of the through hole 332 only. The conductive wall 334 has a semi-circular or a C-shaped cross-sectional structure and electrically connects with the first via lands 322, 324, 326 through the first conductive vias 323, 325 to form the signal transmission structure 300a. In addition, another signal transmission structure 300b is also formed side by side to the aforementioned signal transmission structure 300a to form a differential-pair signal transmission structure. Since the signal transmission structure 300b is identical to the signal transmission structure 300a, a description of its structure and function is omitted.

In the present embodiment, the signal transmission structure 300a further comprises a plurality of second conductive vias 343, 345 and a plurality of second via lands 344, 346, for example. The second conductive vias 343, 345 connect with the neighboring second via lands 344, 346. The second via land 346 covers a portion of the other end of the through hole 332. Furthermore, the conductive wall 334 is electrically connected to the second via lands 342, 344, 346 through the second conductive vias 343, 345. In addition, the signal transmission structure 300a further includes a first circuit line 302 and a second circuit line 304 disposed on the uppermost layer of the top circuit structure and the bottommost layer of the bottom circuit structure, for example. The first circuit line 302 and the second circuit line 304 electrically connect with the conductive vias 323, 343 through the connection pads 322 and 342 and serve as signal lines for connecting to an electronic device.

The differential pair signals in the top circuit structure can be transmitted to the bottom circuit structure in sequence through the signal transmission structures 300a and 300b. The equivalent formula of the characteristic impedance of the differential signals is:

$$Z = \sqrt{\frac{L_s - L_m}{C_s + C_m}},$$

where
  $Z$: the characteristic impedance of differential signal,
  $L_s$: the equivalent inductance of the signal transmission line,
  $C_s$: the equivalent capacitance of the relative ground terminal,
  $L_m$: the inductance coupling between the differential signals,
  $C_m$: the capacitance coupling between the differential signals.

Because the two conductive walls 334 and 338 are located on the inner wall of the first through hole 332 and the second through hole 336 furthest from each other, the distance between the conductive walls 334 and 338 is widened. When the differential signal passes through the pair of signal transmission structures 300a and 300b, the capacitance coupling $C_m$ and cross talk between the differential signals are reduced and the characteristic impedance $Z$ of the differential signals are increased. Consequently, signal reflection and losses in the differential signals due to impedance mismatch are minimized.

In the present embodiment, the area of the first via land 326 or the second via land 346 can be further reduced so that the first via land 326 and the second via land 346 are further apart to reduce the capacitor effect of two neighboring signals. Thus, the capacitance coupling $C_m$ between the differential signals is reduced to increase the characteristic impedance Z of the differential signals. Hence, in a high speed and high frequency signal transmission, the characteristic impedance can approach the original design impedance value and the return loss of the differential-pair signal transmission structure can improve over the conventional design by about 10 dB. In the meantime, the operating frequency range at a high frequency is also increased to provide a higher signal transmission quality.

Accordingly, the present invention uses via lands that occupy a smaller area and non-circular hollow column of conductive walls to reduce the mismatch in characteristic impedance during signal transmission. Hence, more continuous impedance is obtained when signals are transmitted through the two via lands and their corresponding conductive walls. As a result, signal reflection in signal transmission operations due to impedance mismatch is minimized and the resulting signal transmission quality is improved.

In summary, major advantages of the signal transmission structure and circuit substrate of the present invention include:

1. Because the conductive wall covers only a portion of the inner wall of the through hole and each through hole only has a single conductive wall, the signal transmission line and the conductive wall form an impedance with a higher degree of continuity. Hence, signal reflection due to impedance mismatch is reduced and the quality of signal transmission is greatly improved.
2. Because the conductive wall only covers a portion of the inner wall of the through hole, the signal transmission line and the conductive wall form an impedance with a higher degree of continuity. Hence, the dropping of the return loss resulting from the passage of the signal through the through hole is increased.
3. Because of more continuous impedance between the conductive wall and the via land, the insertion loss due to the transmission of a high frequency signal is reduced so that energy loss in a high frequency signal transmission is minimized. Ultimately, high frequency signals can be transmitted with little distortion.
4. Through a reduction in the cross-sectional area of the conductive wall, the distance between the differential pairs of signal transmission structure is increased within a limited or a high-density circuit layout area. Consequently, capacitance coupling and cross talk between differential signals are reduced.
5. Through a reduction in the area of the via land, the distance between the differential pairs of signal transmission structure is increased within a limited or a high-density circuit layout area. Consequently, capacitance coupling and cross talk between differential signals are reduced.
6. The signal transmission structure can be adopted in many types of signal transmission designs including large printed circuit boards and packaging substrates.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A differential pair signal transmission structure suitable for a multi-layered circuit board having a core layer with a top surface, a bottom surface, a first through hole and a second through hole, wherein the first and the second through holes link the top surface with the bottom surface for transmitting a differential pair of signals, wherein the differential pair signal transmission structure comprising:
   a pair of first conductive vias;
   a pair of first via lands respectively connecting to one ends of the pair of first conductive vias on the top surface of the core layer to cover first ends of the first and the second through holes respectively; and
   a pair of conductive walls respectively located only on a portion of the inner wall of the first through hole and a portion of the inner wall of the second through hole such that the pair of conductive walls are respectively electrically connected to the pair of first conductive vias through the first via lands,
   wherein the pair of conductive walls are located away from each other and have a C-shaped sectional profile.

2. The differential pair signal transmission structure of claim 1, wherein the pair of first via lands partially expose the first ends of the first and the second through holes respectively.

3. The differential pair signal transmission structure of claim 1, further comprises a pair of second conductive vias and a pair of second via lands, wherein the pair of second via lands are respectively electrically connected to one ends of the pair of second conductive vias and located on the bottom surface of the core layer to cover second ends of the first and the second through holes respectively.

4. The differential pair signal transmission structure of claim 3, wherein the pair of second via lands partially expose the second ends of the first and the second through holes respectively.

5. The differential pair signal transmission structure of claim 1, wherein the pair of the conductive walls are respectively located on the inner walls of the first and the second through holes, facing but having the furthest distance away from each other and with each conductive wall having a semi-circular sectional profile.

6. A circuit substrate, comprising:
   a core layer having a top surface, a bottom surface, a first through hole and a second through hole, wherein the first and the second through holes link the top surface with the bottom surface for transmitting a differential pair of signals;
   a top circuit structure disposed on the top surface of the core layer and having a pair of first conductive vias and a pair of first via lands, wherein the pair of first via lands respectively connecting to one ends of the pair of first conductive vias are located on the top surface of the core layer to cover first ends of the first and the second through holes respectively; and
   a pair of conductive walls respectively located only on a portion of the inner wall of the first through hole and a portion of the inner wall of the second through hole such that the pair of conductive walls are electrically connected to the pair of first conductive vias through the first via lands respectively,
   wherein the pair of conductive walls are located away from each other and have a C-shaped sectional profile.

7. The differential pair signal transmission structure of claim 6, wherein the pair of first via lands partially expose the first ends of the first and the second through holes respectively.

8. The circuit substrate of claim 6, further comprising:
   a bottom circuit structure disposed on the top surface of the core layer and having a pair of second conductive vias and a pair of second via lands, wherein the pair of second via lands are respectively electrically connected to one ends of the pair of second conductive vias and located on the bottom surface of the core layer to cover second ends of the first and the second through holes respectively.

9. The circuit substrate of claim 8, wherein the pair of second via lands partially expose the second ends of the first and the second through holes respectively.

10. The circuit substrate of claim 6, wherein the pair of the conductive walls are respectively located on the inner walls of the first and the second through holes, facing but having the furthest distance away, from each other and with each conductive wall having a semi-circular sectional profile.

* * * * *